US008853079B2

(12) United States Patent
Lin et al.

(10) Patent No.: US 8,853,079 B2
(45) Date of Patent: Oct. 7, 2014

(54) FUSE DEVICE

(71) Applicant: Taiwan Semiconductor Manufacturing Company, Ltd., Hsinchu (TW)

(72) Inventors: Jyun-Ying Lin, Wujie Township (TW); Chun-Yao Ko, Hsinchu (TW); Ting-Chen Hsu, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/151,862

(22) Filed: Jan. 10, 2014

(65) Prior Publication Data
US 2014/0124891 A1    May 8, 2014

Related U.S. Application Data

(62) Division of application No. 13/107,409, filed on May 13, 2011, now Pat. No. 8,653,623.

(60) Provisional application No. 61/473,991, filed on Apr. 11, 2011.

(51) Int. Cl.
*H01L 21/44* (2006.01)
*H01L 23/525* (2006.01)
*H01L 21/768* (2006.01)

(52) U.S. Cl.
CPC ...... *H01L 21/76886* (2013.01); *H01L 23/5256* (2013.01)
USPC .......................................................... 438/682

(58) Field of Classification Search
CPC .................................................. H01L 23/5256
USPC .................................. 438/132, 300, 478, 682
See application file for complete search history.

(56) References Cited

U.S. PATENT DOCUMENTS

| | | | |
|---|---|---|---|
| 6,661,330 B1 | 12/2003 | Young | |
| 2005/0269715 A1 | 12/2005 | Yoo | |
| 2008/0277756 A1 * | 11/2008 | Min et al. | 257/529 |
| 2011/0217812 A1 | 9/2011 | Hedler et al. | |
| 2012/0044744 A1 | 2/2012 | Chung | |

FOREIGN PATENT DOCUMENTS

CN         1926681         3/2007

OTHER PUBLICATIONS

Sasaki, Takahiko et al., "Melt-Segregrate-Quench Programming of Electrical Fuse", IEEE 05CH37616 43rd Annual International Reliability Physics Symposium, San Jose, CA, 2005, pp. 347-351.
Tian, C. et al., "Reliability Qualification of COSI2 Electrical Fuse for 90NM Technology", IEEE 06CH37728 44th Annual International Reliability Physics Symposium, San Jose, CA, 2006, pp. 392-397.

* cited by examiner

*Primary Examiner* — Bradley K Smith
(74) *Attorney, Agent, or Firm* — Lowe Hauptman & Ham, LLP

(57) ABSTRACT

A method of forming a device includes forming a silicon-containing line continuously extending between a first node and a second node. A first silicide-containing portion and a second silicide-containing portion are formed over the silicon-containing line. The first silicide-containing portion is separated from the second silicide-containing portion by a predetermined distance, and the predetermined distance is substantially equal to or less than a length of the silicon-containing line.

10 Claims, 13 Drawing Sheets

FUSE DEVICE

CROSS REFERENCE TO RELATED APPLICATIONS

The present application is a divisional of U.S. application Ser. No. 13/107,409, filed May 13, 2011, which claims priority of U.S. Provisional Application No. 61/473,991, filed Apr. 11, 2011, which are incorporated herein by reference in their entireties.

TECHNICAL FIELD

The present disclosure relates generally to the field of semiconductor devices and, more particularly, to a fuse device and methods of forming the same.

BACKGROUND

Various one-time programmable (OTP) devices have been provided and used in the semiconductor industry. The OTP devices can be, for example, mask read only memory (Mask ROM), electrical programmable ROM (EPROM), etc. An e-fuse OTP device uses a fuse element connected to a pull-down transistor. By selectively blowing fuses within an integrated circuit, which has multiple potential uses, a generic integrated circuit design may be economically manufactured and adapted to a variety of customer uses.

Fuses are incorporated in the design of the integrated circuits, and are selectively blown, for example, by passing an electrical current of a sufficient magnitude to cause melting or agglomeration, thereby creating a more resistive path or an open circuit. The process of selectively blowing fuses is referred to as "programming."

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
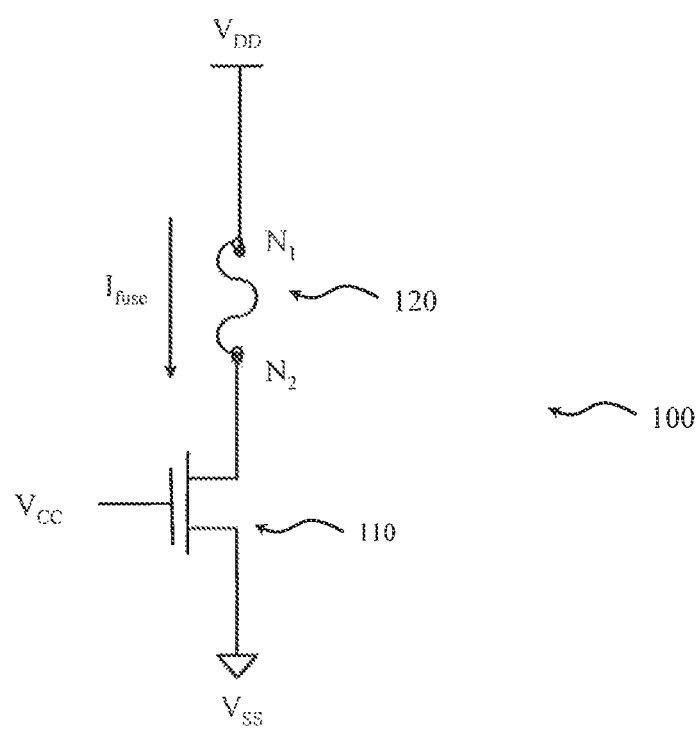
FIG. 1 is a schematic drawing illustrating an exemplary one-time programmable (OTP) device.

An e-fuse OTP device known to the inventors has a fuse element connected to a pull-down transistor. The fuse element has a silicide portion that is disposed on a silicon portion. Both the silicide portion and the silicon portion of the fuse element continuously extend between electrode nodes and are not disrupted before programming.

Applicants found that a high programming current usually is used to program the e-fuse OTP device by blowing out the fuse element. To accommodate the high current, the pull-down transistor that is connected to the fuse element usually has a great width. Due to the high programming current and the large transistor width, the described fuse type OTP device faces obstacles in the shrinking technology nodes and for low-power application. Accordingly, new structures of e-fuse OTP devices are desired.

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a schematic drawing illustrating an exemplary one-time programmable (OTP) device. In FIG. 1, an OTP device 100 includes at least one transistor, e.g., a transistor 110, and a fuse 120. The transistor 110 is electrically coupled with the fuse 120 in series between power voltages $V_{SS}$ and $V_{DD}$. In some embodiments, a node $N_1$ is between the fuse 120 and the power voltage $V_{DD}$. A node $N_2$ is between the fuse 120 and the transistor 110. In some embodiments, the transistor 110 can be an N-type metal-oxide-semiconductor (MOS) transistor, a P-type transistor, other transistor devices, and/or any combinations thereof. In other embodiments, the transistor 110 can be referred to as a pull-down transistor.

In some embodiments programming the OTP device 100 to a logic "0" state, the transistor 110 is turned off such that no substantial current flows through the fuse 120 and the fuse 120 is intact. In other embodiments programming the OTP device 100 to a logic "1" state, a voltage $V_{CC}$ is applied to the gate of the transistor 110 so as to turn on the transistor 110. The turned-on transistor 110 electrically couples the power voltage $V_{SS}$ and the node $N_2$, such that a fuse current $I_{fuse}$ flows through both the transistor 110 and the fuse 120. The fuse current $I_{fuse}$ can blow out the fuse 120, such that the resistance of the fuse 120 increases by a tremendous magnitude.

Figure 2A:
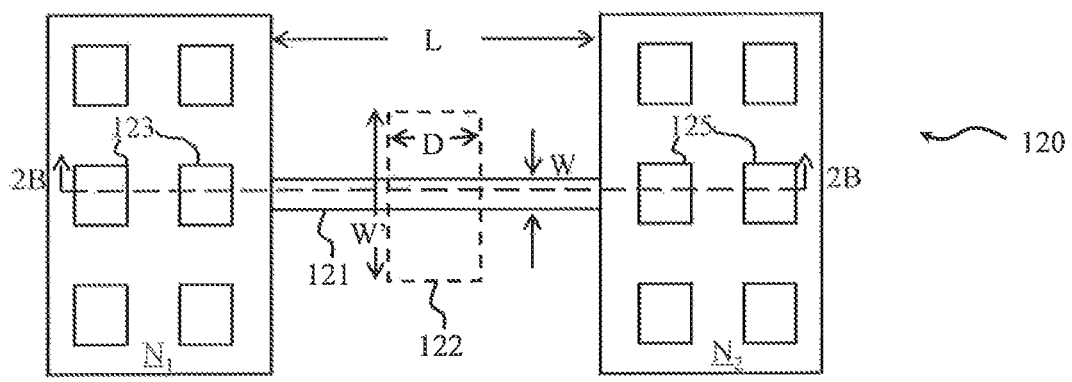
FIG. 2A is a schematic top view showing an exemplary fuse of the OTP device.
Figure 2B:
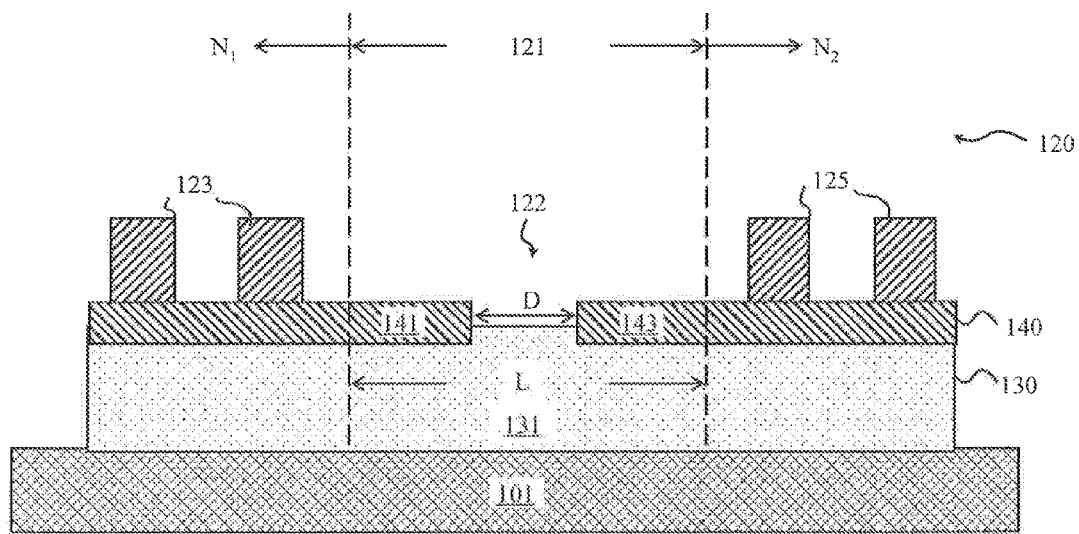
FIG. 2B is a schematic cross-sectional view of the exemplary fuse taken along a section line 2B-2B of FIG. 2A.

FIG. 2A is a schematic top view showing an exemplary fuse of the OTP device. FIG. 2B is a schematic cross-sectional view of the exemplary fuse taken along a section line 2B-2B of FIG. 2A. In FIGS. 2A-2B, the fuse 120 includes a fuse line 121 that is disposed between the nodes $N_1$ and $N_2$. In some embodiments, the fuse line 121 can be disposed over a substrate 101 as shown in FIG. 2B. In other embodiments, the fuse line 121 can be disposed over an isolation structure (not shown) that is disposed over the top surface of the substrate 101. The isolation structure can include a shallow trench isolation (STI) structure and/or a local oxidation of silicon (LOCOS) structure.

In some embodiments, the substrate 101 can include an elementary semiconductor including silicon or germanium in a crystal, a polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT).

Referring to FIGS. 2A-2B, the fuse 120 can include a silicon-containing line 131 that is disposed over the substrate 101. In some embodiments, the silicon-containing line 131 is a portion of a silicon-containing layer 130. The silicon-containing line 131 continuously extends between the nodes $N_1$ and $N_2$ of the fuse 120 for electrical connection therebetween. In some embodiments, the silicon-containing line 131 can have a length L and a width that is substantially equal to a width W of the fuse line 121 as shown in FIG. 2A. The silicon-containing line 131 can be made of at least one material, such as polysilicon, amorphous silicon, silicon-germanium, other silicon-containing materials having a resistance that is substantially different from a silicide material, and/or any combinations thereof.

Referring to FIG. 2B, the fuse 120 can include silicide-containing portions 141 and 143 that are disposed over the silicon-containing line 131. The silicide-containing portions 141 and 143 can be portions of a silicide-containing layer 140. The silicide-containing portions 141 and 143 are separated from each other by a predetermined distance D of a region 122. In some embodiments, the distance D is substantially equal to or less than the length L of the silicon-containing line 131. In other embodiments, the distance D is about 50% or less of the length L of the silicon-containing line 131. In still other embodiments, the distance D is about 40% or less of the length L of the silicon-containing line 131. In some embodiments, the silicide-containing portions 141 and 143 can be made of at least one silicide material, such as titanium silicide, cobalt silicide, nickel silicide, other silicide materials having a resistance that is substantially lower than a silicon-containing material, and/or any combinations thereof.

Referring again to FIGS. 2A and 2B, contact regions 123 and 125 can be disposed over the silicide-containing layer 140 in the nodes $N_1$ and $N_2$, respectively, for electrical connections. In some embodiments, the contact regions 123 and 125 can be made of at least one conductive material, such as such as tungsten, aluminum, copper, titanium, tantalum, other proper conductive materials, and/or combinations thereof.

Figure 2C:
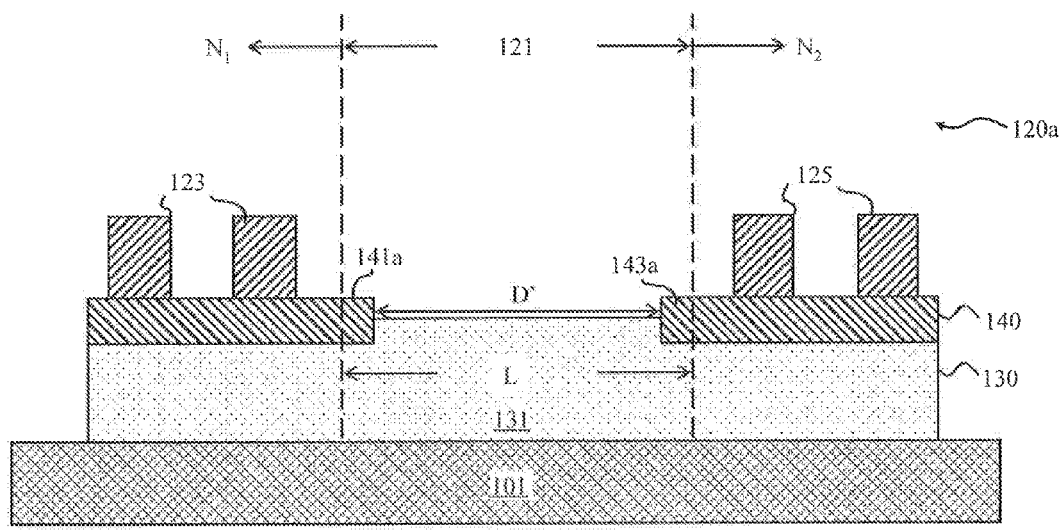
FIG. 2C is a schematic cross-sectional view of the exemplary fuse after programming.
Figure 2D:
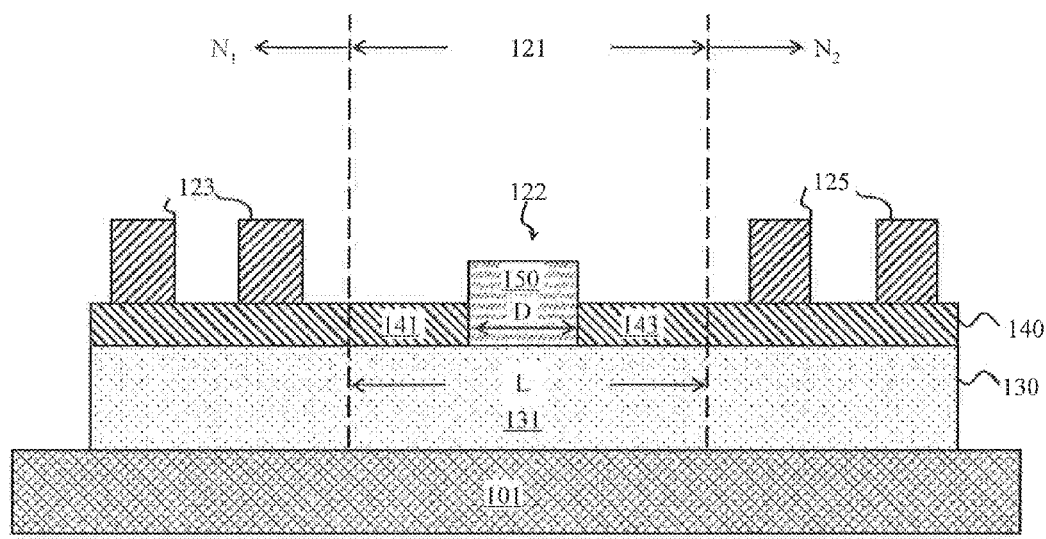
FIG. 2D is a schematic cross-sectional view of another exemplary fuse.

In some embodiments, a dielectric material can be disposed between the silicide-containing portions 141 and 143. For example, a dielectric material 150 can be disposed in the region 122 between the silicide-containing portions 141 and 143 as shown in FIG. 2D. The dielectric material 150 can be made of at least one dielectric material, such as silicon oxide, silicon nitride, silicon oxynitride, silicon carbide, silicon oxycarbide, silicon carbon nitride, other dielectric materials, and/or any combinations thereof. In some embodiments, the dielectric material 150 is thicker than each of the silicide-containing portions 141 and 143. In other embodiments, the dielectric material 150 can include a region at least the same length as or larger than the region 122 as shown in FIG. 2A. In at least this embodiment, the width W' of the dielectric material 150 is larger than the width W of each of the silicide-containing portions 141 and 143. In still other embodiments, the dielectric material 150 can be referred to as a resistance protection oxide (RPO) layer.

Figure 2E:
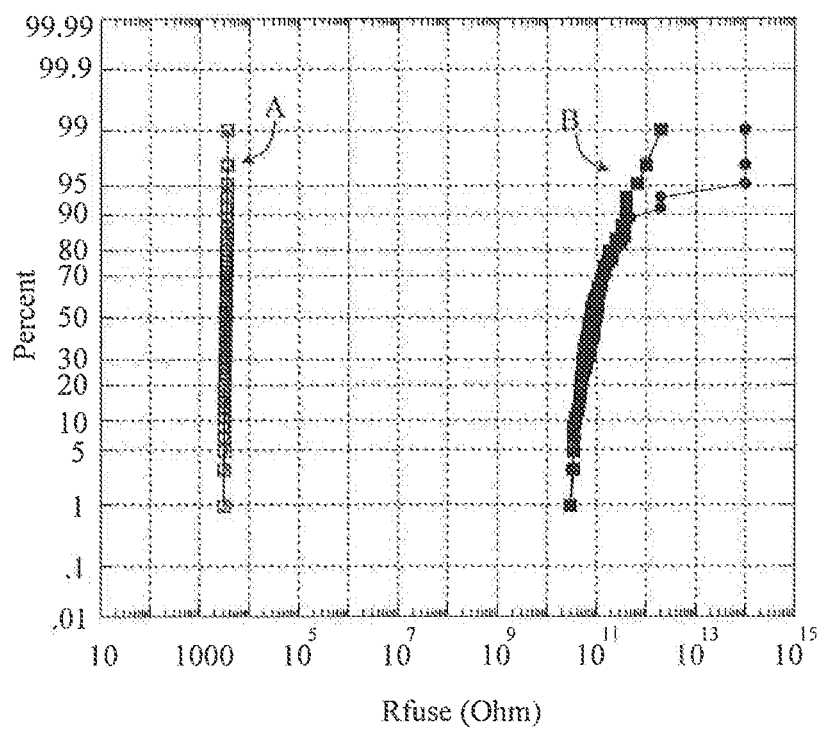
FIG. 2E is an experimental result showing resistance distributions of fuses before and after programming.

For example, a 0.15-μm technology node is adopted to form the OTP device 100. The width W of the fuse 120 can be around 0.15 μm The length L of the fuse 120 can be around 1.33 μm. The distance D between the silicide-containing portions 141 and 143 can be around 0.43 μm. The resistance of the undisrupted fuse 120 can be around 4 KΩ as indicated by resistance "A" in FIG. 2E.

To blow out the fuse 120, the transistor 110 is turned on. The fuse current $I_{fuse}$, e.g., about 1.5 mA can migrate atoms of the silicide-containing portions 141, 143 and/or the silicon-containing line 131, such that the silicide-containing portions 141a and 143a of the blown-out fuse 120a are further separated from each other as shown in FIG. 2C. The distance D' between the silicide-containing portions 141a and 143a is larger than the distance D shown in FIG. 2B. The resistance of the blown-out fuse 120a can be larger than that of the undisrupted fuse 120 by around 6-7 orders of magnitude as indicated by resistance "B" in FIG. 2E. With the huge resistance difference of the undisrupted fuse 120 and the blown-out fuse 120a, the logic states are programmed into various OTP devices.

As noted, the intact fuse 120 has the silicide-containing portions 141 and 143 that are separated by the predetermined distance D or the dielectric material 150. With the discontinuity of the silicide-containing portions 141 and 143, the fuse 120 has a resistance that is substantially higher than a resistance of a fuse structure known to the inventors that has an undisrupted silicide line, e.g., 4 KΩ to 100 Ω, respectively.

It is also noted that a high current, e.g., about 35 mA, may be applied to generate a sufficient heat to blow out the low resistance fuse structure previously known to the inventors. To accommodate such a great current, a pull-down transistor that is connected to the low resistance fuse usually has a large width, e.g., about 60 μm. Due to the high programming current and large transistor width, the fuse type OTP known to the inventors faces obstacles in shrinking technology nodes and for low-power application.

Substantially different from the low resistance fuse structure, the fuse 120 has a resistance, e.g., about 4 kΩ that is substantially higher than the resistance, e.g., about 100 Ω of the conventional fuse element. The high resistance of the fuse 120 can be utilized in conjunction with a low programming current, e.g., 1.5 mA, to generate a desired heat to blow out the fuse 120. As the low current is applied, the size of the transistor 110 can be substantially scaled down to, for example, a tenth of the width of the fuse element known to the inventors. From the foregoing, the cell size of the OTP device 100, compared with the cell size of the conventional OTP device, can be reduced by around 70%. The OTP device 100 can be used in a high-density application without sacrificing area of an integrated circuit. The programming current of the OTP device 100 can also be reduced by around 95%. Due to the low programming current, the OTP device 100 can be applied in a low-power product.

It is noted that the resistances and/or programming currents described above are merely exemplary and may vary depending on changes of the technology node applied for forming the OTP device. In some embodiments, the programming current or the fuse current can be about 10 mA or less. In other embodiments, the programming current or the fuse current can be about 3 mA or less.

Figure 3:
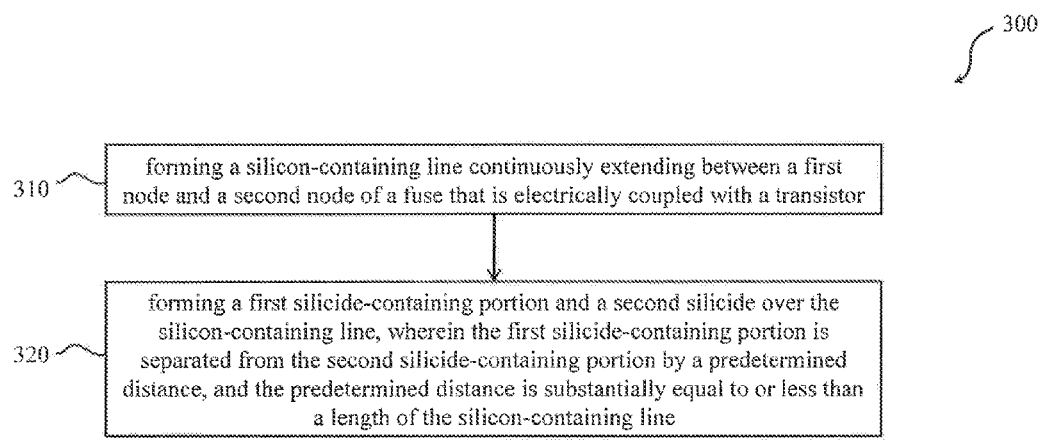
FIG. 3 is a flowchart of an exemplary method of forming an OTP device.
Figure 4A:
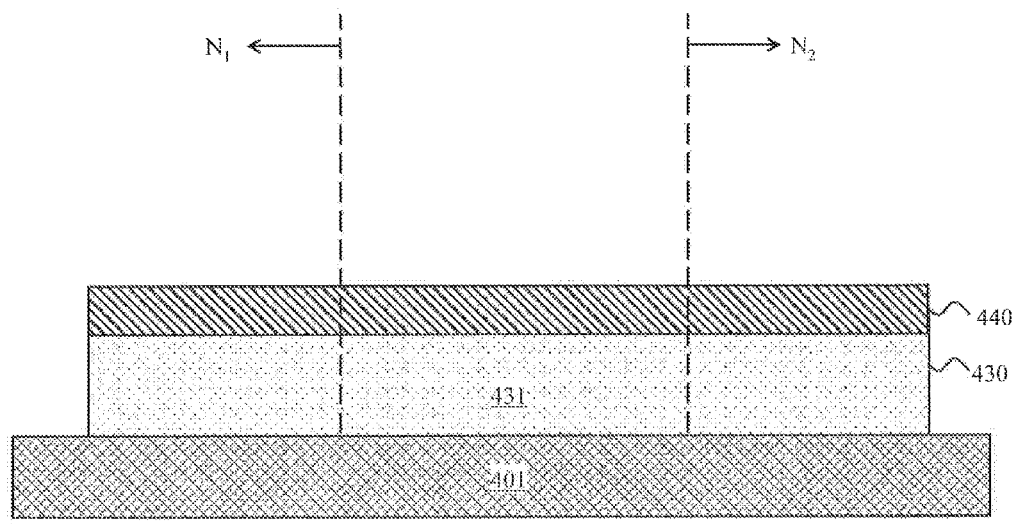
FIGS. 4A-4C are schematic cross-sectional views of the OTP device during various fabrication stages of a first exemplary method.
Figure 4B:
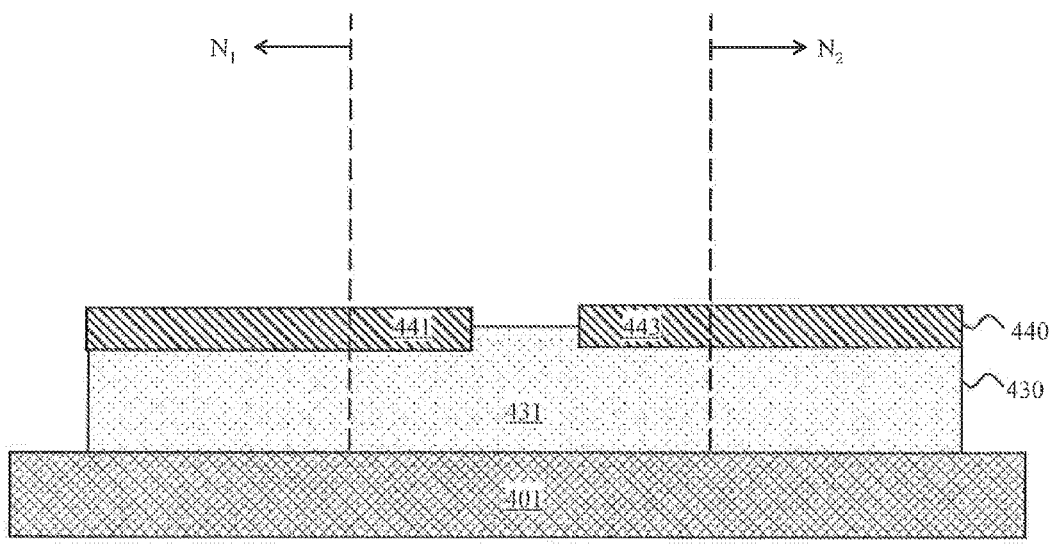
Figure 4C:
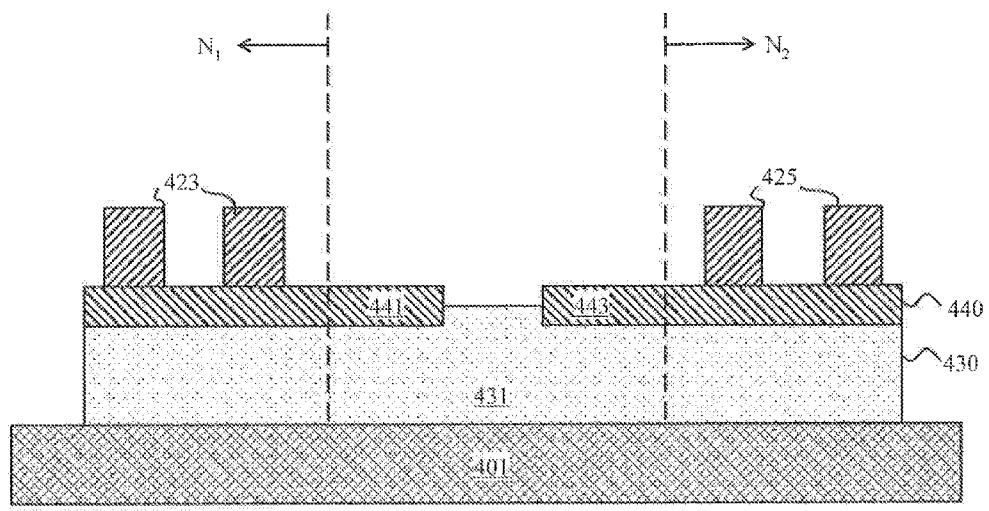
Figure 5A:
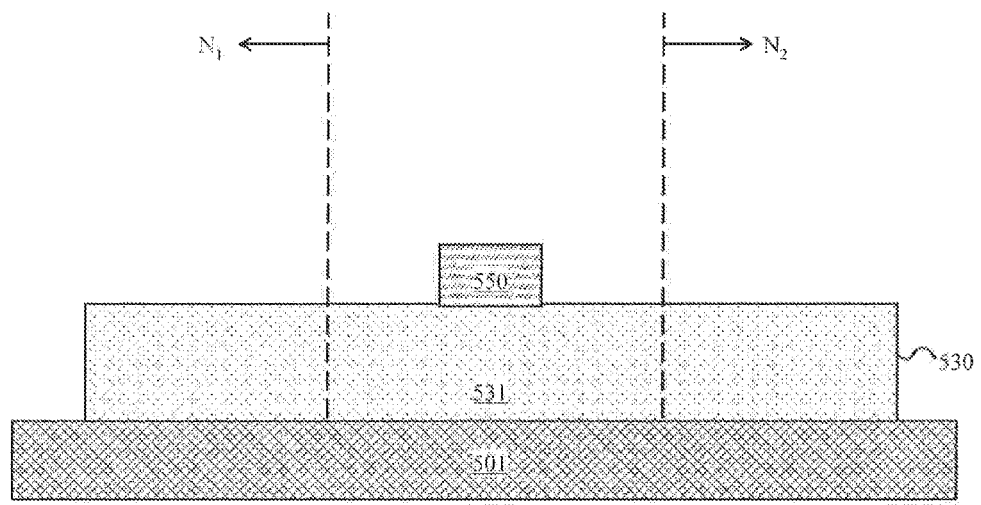
FIGS. 5A-5C are schematic cross-sectional views of the OTP device during various fabrication stages of a second exemplary method.
Figure 5B:
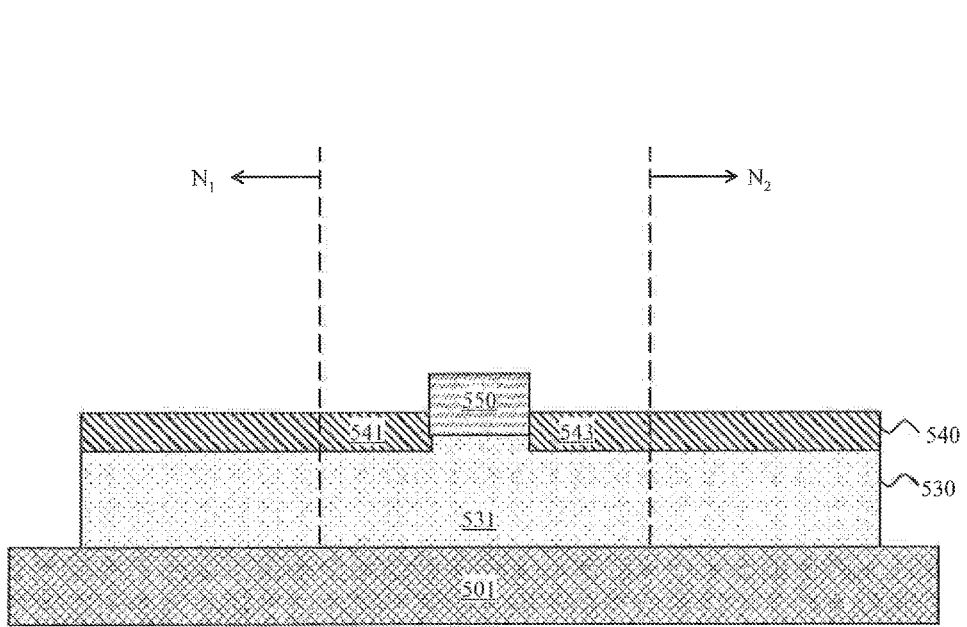
Figure 5C:
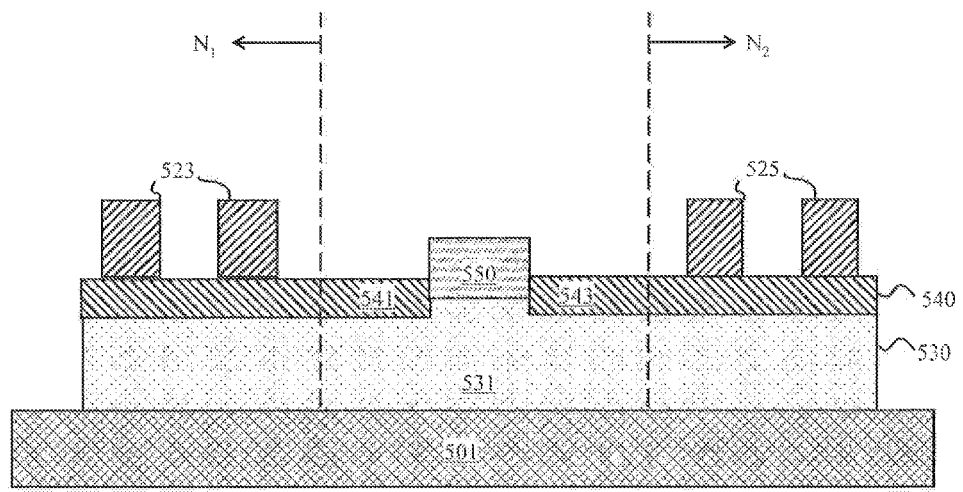

FIG. 3 is a flowchart of an exemplary method of forming an OTP device. FIGS. 4A-4C are schematic cross-sectional views of the OTP device during various fabrication stages of a first exemplary method. FIGS. 5A-5C are schematic cross-sectional views of the OTP device during various fabrication stages of a second exemplary method. Items of FIGS. 4A-4C and 5A-5C that are the same or similar items in FIGS. 2B and 2D are indicated by the same reference numerals, increased by 300 and 400, respectively. It is understood that methods of FIGS. 3, 4A-4C and 5A-5C have been simplified for a better understanding of the concepts of the present disclosure. Accordingly, it should be noted that additional processes may be provided before, during, and after the methods of FIGS. 3, 4A-4C and/or 5A-5C, and that some other processes may only be briefly described herein.

Referring to FIG. 3, a method 300 of forming an OTP device includes forming a silicon-containing line continuously extending between a first node and a second node of a fuse that is electrically coupled with a transistor (block 310). The method 300 also includes forming a first silicide-containing portion and a second silicide over the silicon-containing line, wherein the first silicide-containing portion is separated from the second silicide-containing portion by a predetermined distance, and the predetermined distance is substantially equal to or less than a length of the silicon-containing line (block 320).

For example, a silicon-containing layer 430 can be formed over a substrate 401. The silicon-containing layer 430 can include a region referred to as a silicon-containing line 431. The silicon-containing line 431 can continuously extend between the nodes $N_1$ and $N_2$. The silicon-containing layer 430 can be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Referring to FIG. 4A, a silicide-containing layer 440 can be formed and continuously extend over the silicon-containing layer 430. In some embodiments, a metallic material that is utilized to form the silicide-containing layer 440 can be deposited over the silicon-containing layer 430 by using physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After the deposition, the salicidation process may continue with a reaction between the deposited metallic material and the top portion of the silicon-containing layer 430 at an elevated temperature that is selected based on the specific material or materials. This is also referred to as annealing, which may include a rapid thermal process (RTP). The reacted silicide may be formed by a one-step RTP or multiple-step RTPs. After the salicidation process, the non-reacted metallic material is removed.

Referring to FIG. 4B, a portion of the silicide-containing layer 440 is removed so as to form silicide-containing portions 441 and 443 over the silicon-containing line 411. In some embodiments, the removal process can include forming a patterned mask layer (not shown) covering the silicide-containing portions 441 and 443 of the silicide-containing layer 440. An etching process then removes the portion of the silicide-containing layer 440 that is not covered by the patterned mask layer. After the removal of the portion of the silicide-containing layer 440, the patterned mask layer is removed and the structure shown in FIG. 4B is achieved.

Referring to FIG. 4C, contact regions 423 and 425 can be formed within the nodes $N_1$ and $N_2$, respectively. The contact regions 423 and 425 can be formed by, for example, physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof.

In some embodiments, the method 300 can optionally include forming a dielectric material between the first and second silicide-containing portions. For example, after the formation of a silicon-containing layer 530 over a substrate 501, a dielectric material 550 can be formed over a silicon-containing line 531 of the silicon-containing layer 530 as shown in FIG. 5A.

Referring to FIG. 5B, a metallic material (not shown) that is utilized to form a silicide-containing layer 540 can be formed over the silicon-containing layer 530 and the dielectric material 550. After the deposition, the salicidation process may continue with a reaction between the deposited metallic material and the top portion of the silicon-containing layer 530 at an elevated temperature that is selected based on the specific material or materials. As the dielectric material 550 covers a top region of the silicon-containing layer 531, the covered region of the silicon-containing layer 531 is free from being reacted with the metallic material to form a silicide region. After the salicidation process, a portion of the metallic material that is disposed over the dielectric material 550 and does not react with the silicon-containing line 530 is removed. As shown in FIG. 5B, the dielectric material 550 is formed between and separates the silicide-containing portions 541 and 543.

Referring to FIG. 5C, contact regions 523 and 525 can be formed within the nodes $N_1$ and $N_2$, respectively. The contact regions 523 and 525 can be formed by, for example, physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof.

In a first exemplary embodiment of this application, a one-time programmable (OTP) device includes at least one transistor that is electrically coupled with a fuse. The fuse includes a silicon-containing line continuously extending between a first node and a second node of the fuse. A first silicide-containing portion is disposed over the silicon-containing line. A second silicide-containing portion is disposed over the silicon-containing line. The second silicide-containing portion is separated from the first silicide-containing portion by a predetermined distance. The predetermined distance is substantially equal to or less than a length of the silicon-containing line.

In a second exemplary embodiment of this application, a method of forming a one-time programmable (OTP) device includes a silicon-containing line continuously extending between a first node and a second node of a fuse that is electrically coupled with a transistor. A first silicide-containing portion and a second silicide are formed over the silicon-containing line, wherein the first silicide-containing portion is separated from the second silicide-containing portion by a predetermined distance, and the predetermined distance is substantially equal to or less than a length of the silicon-containing line.

In accordance with one embodiment, a method of forming a device includes forming a silicon-containing line continuously extending between a first node and a second node. A first silicide-containing portion and a second silicide-containing portion are formed over the silicon-containing line. The first silicide-containing portion is separated from the second silicide-containing portion by a predetermined distance, and the predetermined distance is substantially equal to or less than a length of the silicon-containing line.

In accordance with another embodiment, a method of forming a device includes forming a silicon-containing layer over a substrate. The silicon-containing layer includes a first portion, a second portion, and a silicon-containing line connecting the first portion and the second portion. A first silicide-containing portion and a second silicide-containing portion are formed over the silicon-containing line. The first silicide-containing portion is separated from the second silicide-containing portion by a predetermined distance.

In accordance with another embodiment, a fuse device includes a substrate, a silicon-containing layer over the substrate, and a first silicide-containing portion and a second silicide-containing portion over the silicon-containing line. The silicon-containing layer includes a first portion, a second portion, and a silicon-containing line connecting the first portion and the second portion. The first silicide-containing portion is separated from the second silicide-containing portion. The fuse device has a first resistance when the first silicide-containing portion is separated from the second silicide-containing portion by a first distance. The fuse device has a second resistance when the first silicide-containing portion is separated from the second silicide-containing portion by a second distance. The second resistance is at least 6 orders of a magnitude of the first resistance, and the second distance is greater than the first distance The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, the method comprising:
   forming a silicon-containing line continuously extending between a first node and a second node; and
   forming a first silicide-containing portion and a second silicide-containing portion over the silicon-containing line, wherein the first silicide-containing portion is separated from the second silicide-containing portion by a predetermined distance, and the predetermined distance is substantially equal to or less than a length of the silicon-containing line,
   wherein the forming the first silicide-containing portion and the second silicide-containing portion over the silicon-containing line comprises:
   forming a silicide-containing layer over the silicon-containing line, such that the silicide-containing layer continuously extends between the first and second nodes; and
   removing at least a portion of the silicide-containing layer so as to form the first silicide-containing portion and the second silicide-containing portion over the silicon-containing line.

2. The method of claim 1, wherein the predetermined distance is about 40% or less of the length of the silicon-containing line.

3. The method of claim 1, wherein the forming the silicide-containing layer comprises:
   forming a metallic material over the silicon-containing line; and
   causing the metallic material to react with the silicon-containing line to form the silicide-containing layer.

4. The method of claim 3, wherein the forming the metallic material comprises performing a physical vapor deposition (PVD) process, a plating process, a plasma enhanced CVD (PECVD) process, an atmospheric pressure CVD (APCVD) process, a low pressure CVD (LPCVD) process, a high density plasma CVD (HDPCVD) process, or an atomic layer CVD (ALCVD) process.

5. The method of claim 1, wherein the forming the silicon-containing line comprises performing an atomic layer deposition (ALD) process, a chemical vapor deposition (CVD) process, a remote plasma CVD (RPCVD) process, a plasma enhanced CVD (PECVD) process, or a metal organic CVD (MOCVD) process.

6. A method of forming a device, the method comprising:
   forming a silicon-containing layer over a substrate, the silicon-containing layer including a first portion, a second portion, and a silicon-containing line connecting the first portion and the second portion; and
   forming a first silicide-containing portion and a second silicide-containing portion over the silicon-containing line, the first silicide-containing portion being separated from the second silicide-containing portion by a predetermined distance,
   wherein the forming the first silicide-containing portion and the second silicide-containing portion comprises:
   forming a silicide-containing layer over the silicon-containing line; and
   removing a portion of the silicide-containing layer, the removed portion of the silicide-containing layer defining a region separating the silicide-containing layer into the first silicide-containing portion and the second silicide-containing portion.

7. The method of claim 6, wherein the predetermined distance is about 40% or less of a length of the silicon-containing line.

8. The method of claim 6, wherein the forming the silicide-containing layer comprises:
   forming a metallic material over the silicon-containing line; and
   causing the metallic material to react with the silicon-containing line to form the silicide-containing layer.

9. The method of claim 8, wherein the forming the metallic material comprises performing a physical vapor deposition (PVD) process, a plating process, a plasma enhanced CVD (PECVD) process, an atmospheric pressure CVD (APCVD) process, a low pressure CVD (LPCVD) process, a high density plasma CVD (HDPCVD) process, or an atomic layer CVD (ALCVD) process.

10. The method of claim 6, wherein the forming the silicon-containing layer comprises performing an atomic layer deposition (ALD) process, a chemical vapor deposition (CVD) process, a remote plasma CVD (RPCVD) process, a plasma enhanced CVD (PECVD) process, or a metal organic CVD (MOCVD) process.

\* \* \* \* \*